United States Patent [19]
Dickson et al.

[11] 4,241,424
[45] Dec. 23, 1980

[54] SEMICONDUCTOR DEVICES

[75] Inventors: John F. Dickson, Long Buckby; Raymond E. Oakley, Westbury, both of England

[73] Assignee: Plessey Handel und Investments AG, Zug, Switzerland

[21] Appl. No.: 946,406

[22] Filed: Sep. 27, 1978

[51] Int. Cl.³ .............................................. G11C 11/40
[52] U.S. Cl. .................................... 365/218; 307/238; 365/189
[58] Field of Search ................. 365/218, 289; 307/238

[56] References Cited
U.S. PATENT DOCUMENTS

| | | | |
|---|---|---|---|
| 3,875,567 | 4/1975 | Yamazaki | 365/218 |
| 4,099,069 | 7/1978 | Cricchi et al. | 365/218 |

*Primary Examiner*—Terrell W. Fears
*Attorney, Agent, or Firm*—Fleit & Jacobson

[57] ABSTRACT

A novel mode of operation of an array of MNOS memory transistors is provided which employs the punch through mode of erase and enables a single transistor memory cell to be used. It being arranged that all 'bits' are written into the '1' state and bits are selectively erased to provide the required data pattern.

4 Claims, 1 Drawing Figure

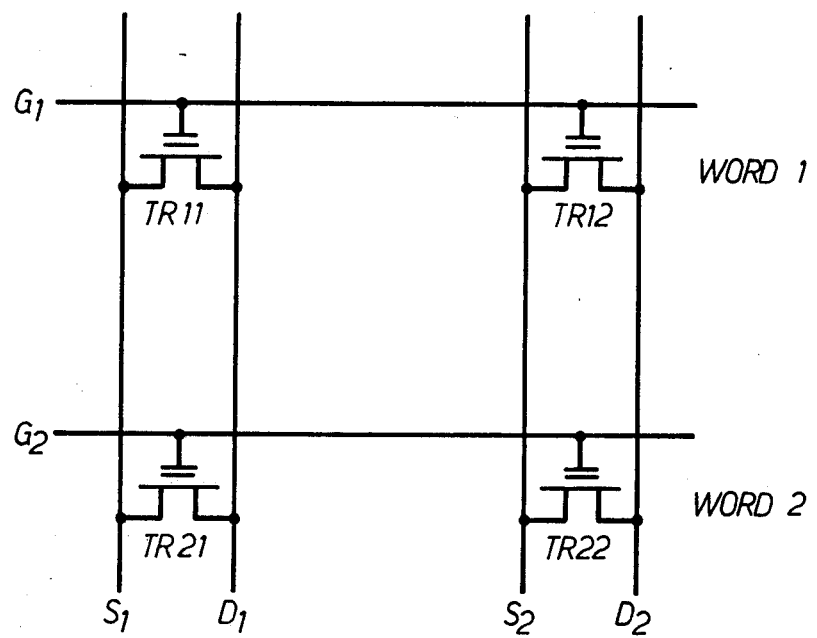

SEMICONDUCTOR DEVICES

BACKGROUND OF THE INVENTION

1. Field of the Invention

This invention relates to semiconductor devices and relates more especially to MNOS transistor devices.

2. Description of the Prior Art

It is known that the MNOS transistor can be operated as a non-volatile memory in two ways, distinguished by the means of carrying out the erase function. The erase function is that phase of the operational sequence during which the selected portion of the memory array has all bits set into the "0" state. For p-channel devices, which form the basis of this example, the "0" is the state with the most positive threshold voltage and which, as a result, is the conducting state during read. A similar situation holds for n-channel devices if the polarities are changed.

Conventionally erase is achieved by applying a sufficiently large voltage between the gate and substrate such that the gate is positive with respect to the substrate. In the punch through erase mode, erase is achieved by biasing the source and drain to a sufficiently large voltage, negative with respect to both gate and substrate. Typically, the gate and substrate are both grounded. For example, see the article entitled "A New, Nonvolatile Read Write Random Access Memory Operation By Means Of Avalanche-Tunnel Injection In MNOS Transistor," by Uchida et al, *Proceedings of the 4th Conference on Solid State Devices* (Tokyo, 1972), *Supplement to the Journal of the Japan Society of Applied Physics*, Vol. 42, 1973, Section 5-2 (pages 151-157), which sets forth a typical punch through erase mode of operation.

The advantage of the conventional approach is that the memory cell is a single transistor. The disadvantage is that the transistors must be in isolated lands which makes the technology more complex and more costly. The advantage of punch through erase is that it uses the simple low cost non-isolated technology. The disadvantage is that it requires a three transistor cell.

A memory circuit consisting of an array of MNOS transistors or an array of three transistor cells is operated in the following way. First, all bits in a selected word are simultaneously erased to the "0" state by either the conventional or punch through method. This is followed by a write operation during which a negative voltage is applied to the gate. Any transistor in the word which has its source and drain at ground has its threshold shifted to the "1" or most negative state. Any transistor in the word which has its source and drain at an intermediate negative potential will experience a reduced shift of threshold. If the source and drain potential is close to that of the gate during write, the threshold shift is small and the transistor remains in the "0" state. Thus the source and drain potential is used during write to determine which bits are programmed into the "1" state and which remain in the "0" state. Finally, during read, a voltage is applied to the gate so as to turn on those devices which are in the "0" state but not those in the "1" state. This sequence can be summarised as erase, write or write inhibit, read.

The erase may be brought about by either the conventional or punch through method.

SUMMARY OF INVENTION

The present invention relates to a novel mode of operation of an array of MNOS memory transistors.

According to one aspect of this invention there is provided a method of operating a matrix array of memory transistors including the steps of writing all transistors into the "1" state, and erasing selected transistors whilst inhibiting erasing of the remaining transistors to provide a required data pattern.

According to a second aspect of the invention there is provided a method of operating a matrix array of field effect memory transistors in which, in order to erase a transistor memory cell, source and drain are taken to a predetermined voltage with respect to gate and substrate potentials and, to inhibit erase, the gate of any transistor to be inhibited is taken to an intermediate voltage with respect to the substrate.

The intermediate voltage may be ½ of the value of the voltage applied to the said source and drain.

In any column of the array which contains no transistor to be erased the sources and the drains of transistors in the column may be held at the said intermediate voltage. This requires that the erase function be inhibited, which is only possible with punch through erase.

BRIEF DESCRIPTION OF THE DRAWING

An exemplary embodiment of the invention will now be described reference being made to the accompanying single FIGURE drawing which depicts a matrix array of memory transistors in accordance with the present invention.

DETAILED DESCRIPTION

First all bits are written into the "1" state and bits are selectively erased to provide the required data pattern.

The write function is as described above, the gate is taken negative with respect to substrate, source and drain, so that all bits in the word are in the "1" state. The punch through erase function is as described above, the source and drain being taken negative with respect to the gate and substrate. The erase inhibit function takes the source and drain negative with respect to the substrate and the gate to an intermediate voltage. The negative gate voltage inhibits the erase so that a "1" is retained. The read function is as before.

Considering the memory array shown in the accompanying drawing, this depicts a 2×2 matrix of memory transistors. Word 1 is the selected word into which a data pattern 0-1 is needed. Data in word 2 is to remain unchanged.

During the 'write' operation gate 1 (G1) is negative and all other terminals zero. Transistors 11 and 12 (TR 11 and TR 12) are shifted to the "1" state. To erase TR 11, source 1 (S1) and drain 1 (D1) are taken negative. To prevent TR 21 from being erased also, gate 2 (G2) is taken to an intermediate negative voltage, typically ¼ of the voltage on S1 and D1. Thus TR 11 is set into the "0" state while TR 21 is unchanged. All other terminals are at zero. TR 12 then has zero on all terminals and so remains in the "1" state. TR 22 has zero on source and drain and the inhibit voltage on the gate which is too small to change the state of TR 22. Thus the data pattern is 0-1 in word 1 with word 2 unchanged.

A further improvement is effected if, during the combined erase-erase inhibit operation the source and drain terminals of the not erased columns (S2 and D2 in the example) are held at the same voltage as the erase inhibit gate voltage (gate 2). In this way any tendency for the erase inhibit voltage to degrade a stored "1" in a location such as 22 is suppressed. This has no effect on non-erased bits in the selected word, e.g. TR 12.

The advantage of this method of operating an array of MNOS transistors is that it uses a one transistor cell and a simple non-isolated technology, where previously the alternatives were a one transistor cell and complex technology or simple technology and a three transistor cell. Thus this invention provides the combination of best packing density with lowest processing, with the consequent reduction in cost/bit.

What we claim is:

1. A method of operating a matrix array of field effect memory transistors, each transistor being formed on a substrate and including a source electrode, a drain electrode and a gate electrode, the method including the steps of:

writing each transistor into a first state;

punch through erasing selected transistors into a second state by establishing the source and drain electrodes of the selected transistors on the one hand at a predetermined potential with respect to the potential level of the gate electrode and substrate on the other; and simultaneously inhibiting said punch through erasing of at least one of the remaining transistors by maintaining the gate electrode of each said at least one of the remaining transistors at a predetermined inhibiting potential;

whereby to provide a required data pattern.

2. A method as claimed in claim 1 in which the predetermined inhibiting potential is ¼ of the value of the predetermined potential of said source and drain electrodes.

3. A method as claimed in any one of claims 1 or 2, in which, in any column of the array which contains no transistor to be erased, the sources and drains of the transistors in the column are held at said predetermined potential.

4. A method as claimed in any one of claims 1 or 3, in which said predetermined inhibiting potential is intermediate said predetermined potential and the potential level of the gate electrode and substrate.

* * * * *